United States Patent [19]

Jones

[11] Patent Number: 5,300,895
[45] Date of Patent: Apr. 5, 1994

[54] METHOD FOR TERMINATING HARMONICS OF TRANSISTORS

[75] Inventor: Martin E. Jones, Plano, Tex.

[73] Assignee: Texas Instruments Incorporated, Dallas, Tex.

[21] Appl. No.: 955,527

[22] Filed: Oct. 1, 1992

[51] Int. Cl.$^5$ .............................................. H03F 3/193
[52] U.S. Cl. ........................................ 330/251; 330/306
[58] Field of Search ............ 330/207 A, 251, 306; 333/175, 176

[56] References Cited

U.S. PATENT DOCUMENTS 5,146,178  9/1992  Nojima et al. ...................... 330/251

*Primary Examiner*—James B. Mullins
*Attorney, Agent, or Firm*—Michael K. Skrehot; James C. Kesterson; Richard L. Donaldson

[57] ABSTRACT

Generally, and in one form of the invention, a method is disclosed for terminating third harmonic frequency of a transistor amplifier comprising: determining the magnitude of the susceptance at the third harmonic frequency of initial circuitry, 41, 43, and 45, attached to the output of a transistor 39, wherein the initial circuitry has no third harmonic termination; determining whether the susceptance of the circuitry presented to the output of the transistor 39 is capacitive or inductive at the third harmonic frequency; and adding a compensating parallel susceptance 60 to the output of the transistor 39 that is substantially equal in magnitude to the susceptance of the circuitry attached to the output of the transistor 39, but capacitive if the susceptance of the circuitry presented to the output of the transistor 39 is inductive, or inductive if the susceptance presented to the output of the transistor 39 is capacitive, whereby the imaginary part of the susceptance of the total circuitry attached to the output of the transistor 39 is made small at the third harmonic frequency.

22 Claims, 2 Drawing Sheets

METHOD FOR TERMINATING HARMONICS OF TRANSISTORS

FIELD OF THE INVENTION

This invention generally relates to methods for terminating harmonics of transistors.

BACKGROUND OF THE INVENTION

Without limiting the scope of the invention, its background is described in connection with amplifiers constructed of NPN-type bipolar transistors. For normal operation, this implies positive base-emitter voltage, positive current into the base terminal, positive collector-emitter voltage, and positive current into the collector terminal.

Small, light-weight, high-efficiency power amplifiers are essential to portable self-powered radio-transmitting equipment such as battery-operated handheld cellular telephones. Efficiency is a figure of merit which quantifies the amount of DC input power required to produce a specified output-signal amplitude. Efficiency translates inversely to power consumption under specified operating conditions. High efficiency is therefore necessary to minimize required battery capacity.

High-efficiency power-amplifier transistors are fabricated using many different basic technologies such as GaAs FET, silicon bipolar, and GaAs heterojunction bipolar. Most of these technologies are compatible with monolithic circuit-integration techniques; allowing resistors, capacitors, diodes, microstrip transmission lines, and other structures to be implemented on the same substrate as the transistors. This circuit-integration capability is another asset when the size and weight restrictions of portable equipment are considered.

A high-efficiency power-amplifier design seeks to maximize the ratio of signal-power output to DC-power input. High-efficiency power amplifiers are usually operated at conduction angles of 180 degrees or less (Class-B or Class-C). The conduction angle refers to the portion of one period of a sinusoidal input signal over which the transistor is "on", or conducting. A full period of the input signal contains 360 degrees.

The signal-frequency behavior of an amplifier operated under large-signal (nonlinear) conditions is dependent upon both the fundamental-frequency and the harmonic-frequency response of the circuits that surround the transistor. Design of the fundamental-frequency impedance of the circuit which couples signal power to the output is based primarily upon the amplifier transistor's desired operating voltage and current. Presenting the correct load impedance to the transistor's output sets the voltage/current ratio for large-signal operation.

High-efficiency transistor performance also requires specific terminations at integral multiples (harmonics) of the signal frequency. Of great importance is the circuit behavior at two and three times the signal frequency. For example, it has been demonstrated that the second-harmonic voltage present at the transistor's collector terminal should be minimized. It has also been demonstrated that amplifier performance is enhanced when a non-zero third-harmonic voltage is present at the transistor's output terminal.

Most nonlinear power amplifiers, especially those operating Class-B or Class-C, generate significant second-harmonic currents in their output circuits. In order to minimize the second-harmonic voltage present at the amplifier-transistor collector terminal, the surrounding circuits are typically designed to present a low impedance to the device at twice the signal frequency.

The optimum third-harmonic output voltage is non-zero, and typical third-harmonic current is relatively small (compared to second-harmonic current). As a result, the surrounding circuitry may attempt to maximize third-harmonic output voltage by presenting a high impedance at three times the signal frequency.

SUMMARY OF THE INVENTION

In the past, the proper termination of harmonics from an amplifier transistor has been accomplished using resonant structures. One prior art method, in particular, employs quarter-wavelength microstrip transmission line stubs to create either open or short circuits at particular harmonic frequencies. For example, to create an open circuit at the third harmonic frequency, a quarter-wavelength open stub would be placed a quarter-wavelength from the output of the amplifier transistor. This approach works well in situations where space is not a critical issue. However, when the termination circuitry is to be included on the same monolithic substrate as the transistor and other active devices, applicant has found that the termination circuitry occupies too much space. For example, a quarter-wavelength transmission line implemented on a GaAs substrate may be near one inch long at frequencies in the 900-MHz cellular phone band.

Other prior art approaches have implemented resonant structures with lumped elements such as inductors and capacitors rather than transmission lines. These elements are generally smaller than transmission-line structures, but introduce other problems.

Terminations for transistor amplifiers generally comprise separate circuitry for loading the amplifier at the fundamental frequency, for terminating the second harmonic frequency, and for terminating the third harmonic frequency. However, resonant circuits designed to present short or open circuits at one harmonic frequency inevitably present residual admittance at another frequency, where they are desired to have no effect. Transmission-line-based implementations of termination circuits may easily be adjusted to overcome these inadequacies without perturbing their resonance, but lumped-element miniaturized circuits found in prior art may not.

In one form of the invention, a method is disclosed for terminating a third harmonic frequency of a transistor amplifier comprising: determining the magnitude of the susceptance at the third harmonic frequency of initial circuitry attached to the output of a transistor, wherein the initial circuitry has no third harmonic network; determining whether the susceptance of the circuitry presented to the output of the transistor is capacitive or inductive at the third harmonic frequency; and adding a compensating susceptance to the output of the transistor that is substantially equal in magnitude to the susceptance of the circuitry attached to the output of the transistor, but capacitive if the susceptance of the circuitry presented to the output of the transistor is inductive, or inductive if the susceptance presented to the output of the transistor is capacitive, whereby the imaginary part of the susceptance of the total circuitry attached to the output of the transistor is made small at the third harmonic frequency.

In another form of the invention, a circuit is disclosed for terminating a third harmonic frequency of a transistor amplifier comprising; a matching circuit connected to an output of the transistor, the matching circuit having a first susceptance at the third harmonic frequency, a bias circuit connected to the output of the transistor, the bias circuit having a second susceptance at the third harmonic frequency, and a compensating susceptance connected to an output of the transistor that is substantially equal in magnitude to the sum of the first susceptance and the second susceptance, but capacitive if the sum is inductive, or inductive if the sum is capacitive, whereby the imaginary part of the susceptance of the total circuitry attached to the output of the transistor is made small at the third harmonic frequency.

In still another form of the invention, a circuit is disclosed for terminating a third harmonic frequency of a transistor comprising; a matching circuit connected to an output of the transistor, the matching circuit having a first susceptance at the third harmonic frequency, a bias circuit connected to the output of the transistor, the bias circuit having a second susceptance at the third harmonic frequency, wherein the sum of the first susceptance and the second susceptance is small at the third harmonic frequency.

An advantage of the invention is that it provides miniaturized in-band tuning, low-impedance second-harmonic termination, and high-impedance third-harmonic termination in a lumped-element form that does not require a dedicated resonant circuit at the third-harmonic frequency.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

When describing parallel networks, it is more convenient to express impedance (series resistance+series reactance) as admittance (parallel conductance+parallel susceptance). High impedance is synonymous with low admittance, and low impedance is synonymous with high admittance. In subsequent paragraphs, parallel circuits will be described in terms of their admittance.

Figure 1:
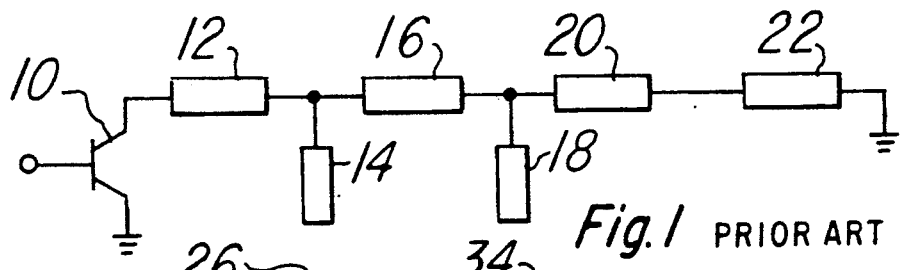
FIG. 1 is a schematic diagram of a prior art amplifier output circuit.

FIG. 1 is a block diagram illustrating one prior art method for achieving the desired signal-frequency impedance as well as the desired second- and third-harmonic terminations. Power-amplifier transistor 10 is coupled to output load 22 by transmission lines 12, 14, 16, and 18, and by complex impedance-matching network 20. Network 20 often consists of multiple elements. Often required, but not illustrated in FIG. 1, are elements for furnishing DC to the collector of transistor 10 and for blocking DC from reaching output load 22. The locations at which these elements appear would depend upon the particular amplifier design. The following three paragraphs provide an idealized discussion of the circuit of FIG. 1.

The electrical lengths of transmission lines 12 and 14 are 90 degrees at three times the signal frequency. The open-circuit-terminated transmission line 14 places a short circuit at the junction of transmission lines 12 and 16 at three times the signal frequency. This appears as an open circuit at the collector of transistor 10, synthesizing the required high impedance at the third harmonic frequency.

The electrical length of transmission line 18 is 90 degrees, and the sum of the electrical lengths of transmission lines 12 and 16 is 180 degrees, at twice the signal frequency. The open-circuit-terminated transmission line 18 places a short circuit at the junction of transmission line 16 and matching network 20 at two times the signal frequency. This appears as a short circuit at the collector of transistor 10, synthesizing the required low impedance at the second harmonic frequency.

In a practical circuit, interaction of the elements requires that the dimensions differ from the idealized case. For example, the third-harmonic resonator (transmission line 14) will possess some residual parallel admittance at the second-harmonic frequency. This would typically necessitate adjustment of transmission line 16. Matching network 20 must also be adjusted to correct for the residual signal-frequency admittances of both resonators.

Many other similar arrangements of transmission-line elements may be configured to yield the correct signal-frequency and harmonic-frequency terminations. These circuits, while adequate for non-miniaturized applications, are difficult to adapt to monolithic integration. This is most apparent at lower operating frequencies, where transmission lines of specified electrical length become physically large.

Figure 2A:
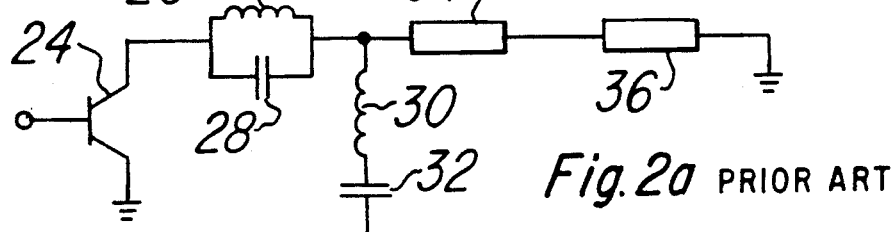
FIG. 2a and 2b are schematic diagrams of prior art implementations of amplifier output circuits.
Figure 2B:
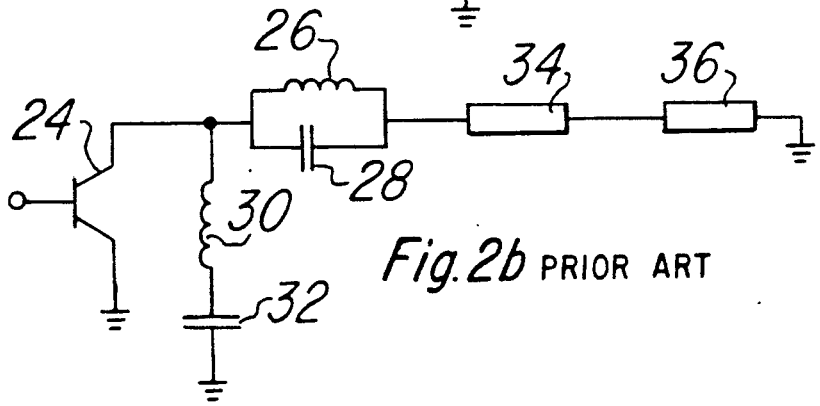

FIGS. 2a and 2b illustrate two other prior art implementations of the power amplifier, which realize harmonic-frequency terminations using capacitor-inductor resonant circuits. In an idealized analysis, inductor 26 is parallel-resonant with capacitor 28 at three times the signal frequency and inductor 30 is series-resonant with capacitor 32 at twice the signal frequency. Matching network 34 transforms the load 36 to the correct signal-frequency impedance at the collector of transistor 24.

While the transmission-line implementations are difficult to miniaturize, the lumped-element prior art has performance disadvantages. The implementations of FIGS. 2a and 2b require very narrowband resonant circuits in order to function as theoretically desired. Both the parallel-resonant circuit 26, 28 and the series-resonant circuit 30, 32 must behave as open circuits at the third-harmonic frequency and as short circuits at the second-harmonic frequency. This ensures that the collector of transistor is loaded with a short-circuit termination at the second-harmonic frequency and an open-circuit termination at the third-harmonic frequency.

In the transmission-line circuit of FIG. 1, a series-element length can be adjusted to compensate for residual-admittance interactions between resonators. There is no such length in the lumped-element prior art, therefore the resonator elements themselves must be adjusted. This may result in resonant frequencies and/or bandwidths other than desired.

Figure 3A:
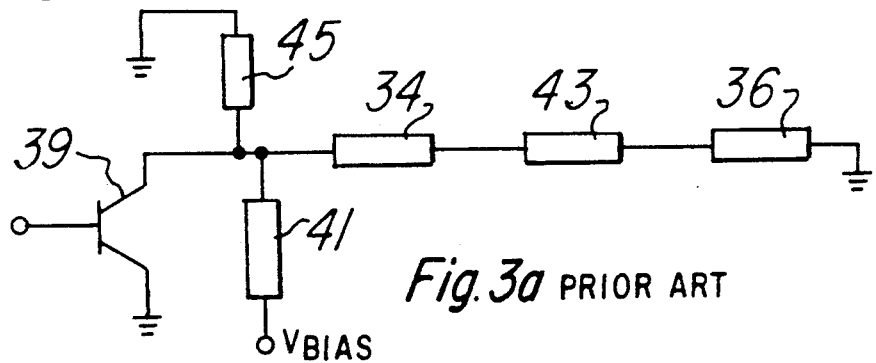
FIG. 3a is a block diagram of the prior art circuit of FIG. 2b.
Figure 3B:
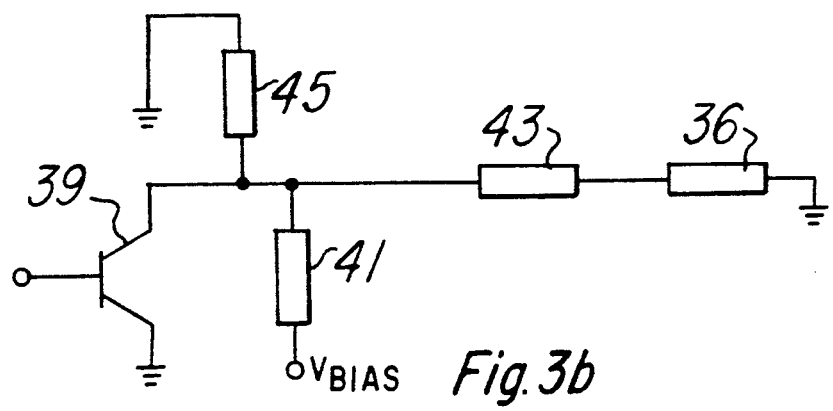
FIG. 3b is a block diagram showing circuitry on the output of a transistor in an amplifier circuit with the desired third-harmonic termination provided without adding any element in the signal path.

The inventive concept described herein overcomes these difficulties by eliminating the discrete third-harmonic resonant circuit located in series with the signal path in the prior art of FIGS. 2a and 2b. In preferred embodiments of this invention, both the second-harmonic termination and the third-harmonic termination are implemented using elements that connect in parallel with the collector of the amplifier transistor. For example, referring to FIG. 3, the third-harmonic termination is accomplished by noting that the bias circuitry 41, the second-harmonic termination 45, and the output-matching network 43 all combine to present a particular admittance to the collector of amplifier-transistor 39 at the third-harmonic frequency. This admittance can be modelled as a parallel combination of a real part (conductance) and an imaginary part (susceptance). By placing an additional parallel susceptance at the collector node, having equal magnitude but opposite sign to the aforementioned susceptance, the imaginary parts of the total admittance will cancel at the third harmonic frequency. The conductance (real part) remains unchanged, therefore the magnitude of the admittance decreases and the third-harmonic termination moves nearer to an open circuit. In a further refinement of this concept, the elements of the various networks connected to the amplifier-transistor's collector node may be adjusted such that their susceptances cancel at the third-harmonic frequency, effectively absorbing the additional component into existing structures.

Figure 4A:
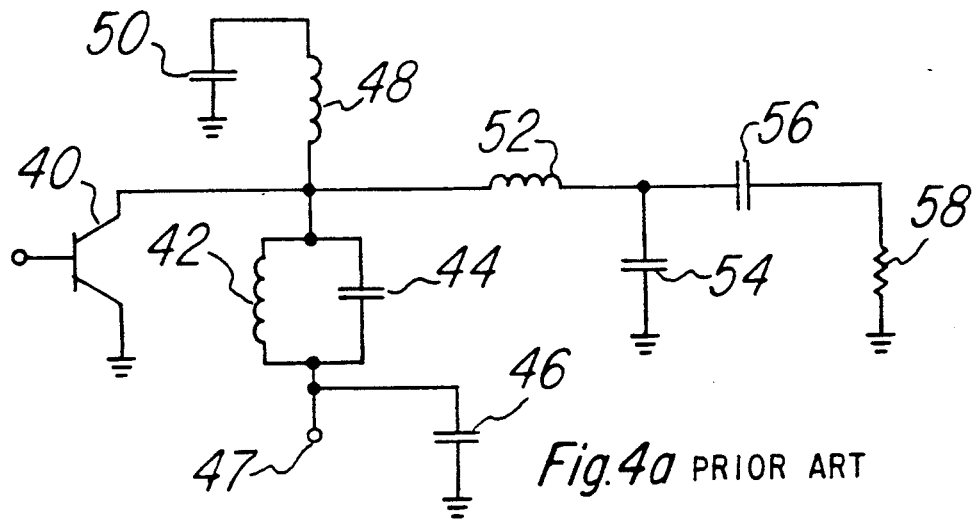
FIG. 4a is a schematic diagram of a circuit having no third-harmonic termination.
Figure 4B:
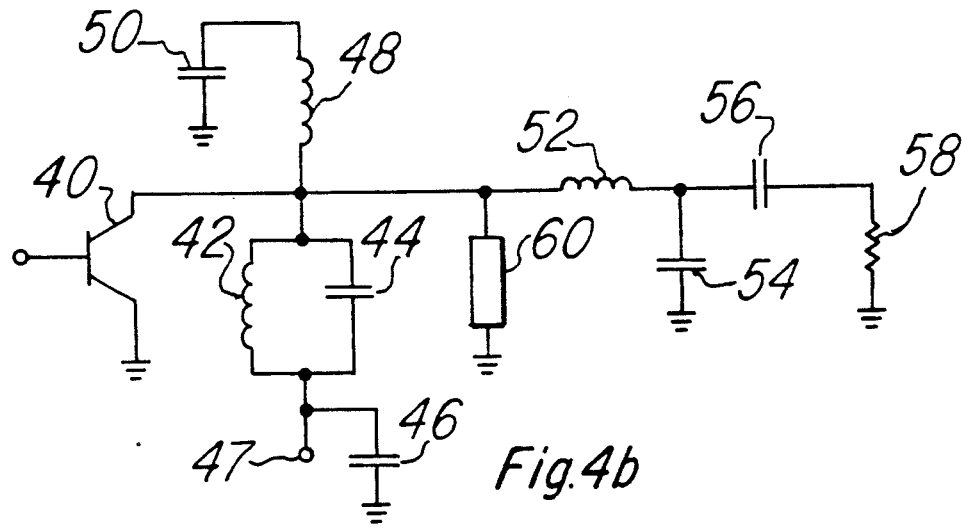
FIG. 4b is a schematic diagram of a first preferred embodiment amplifier circuit where the third-harmonic termination is provided by adding a parallel susceptance.

In a first preferred embodiment of the inventive concept, the circuit of FIG. 4, incorporating an amplifying transistor 40, a bias network 42, 44, 46, a second-harmonic resonator 48, 50, an output-matching network 52 and 54, a blocking capacitor 56, load impedance 58, and third-harmonic resonating element 60, is described. For the purpose of this and following discussions, the impedance of blocking capacitor 56 is assumed to be negligible. Operation of the circuit is first described without element 60, followed by a description of the function of element 60 and the accompanying changes required of the other elements when element 60 is included.

At the fundamental frequency, series L-C circuit 48, 50 is capacitive while parallel L-C circuit 42, 44 is resonant and appears as a high impedance. Parallel-resonant circuit 42, 44 also prevents the fundamental-frequency signal from appearing at the DC-bias node 47, which is additionally bypassed by capacitor 46. Elements 52 and 54 are designed so that, considering the residual capacitance of second-harmonic termination 48, 50, load 58 is transformed to the desired fundamental-frequency impedance at the collector of amplifier-transistor 40. Series inductor 52 and parallel capacitor 54 represent only one of many possible implementations of a tuning network for the fundamental-frequency response.

At the second-harmonic frequency, inductor 48 and capacitor 50 are series-resonant, creating a low impedance from the amplifier-transistor collector to ground. Any second-harmonic impedances presented by other circuit elements are bypassed by this series-resonant circuit. Thus, the surrounding circuitry may be designed with relatively little regard for its effect on the second-harmonic termination.

Without element 60, the third-harmonic termination seen by the collector of transistor 40 is equal to the parallel combination (sum) of the third-harmonic admittances of the fundamental-frequency and second-harmonic networks. At the third-harmonic frequency, second-harmonic termination 48, 50 appears inductive while bias network 42, 44, 46 appears capacitive. The output network 52, 54 appears inductive. Transformation of load 58, as well as loss due to non-ideal components, provides a real part (conductance) of the third-harmonic termination. The total third-harmonic admittance at the collector of amplifier-transistor 40 will therefore, in general, consist of both real and imaginary parts.

Element 60 is used to cancel the imaginary part of third-harmonic admittance at the collector of amplifier-transistor 40, satisfying the conditions required for high-efficiency operation. As stated in the Background of the Invention, it is desirable that the amplifier-transistor collector be presented with a high impedance (low admittance) at the third-harmonic frequency.

By determining the magnitude and polarity of the combined susceptance, and adding a compensating susceptance 60 of equal magnitude and opposite sign, the imaginary part of admittance is essentially neutralized. This leaves the conductance, which may be sufficiently small as not to interfere with efficient amplifier operation. Compensating element 60 may be capacitive or inductive, depending upon whether the equivalent susceptance of the combined remaining circuitry appears to be inductive or capacitive, respectively. Element 60 will also have susceptance at the fundamental frequency, and therefore generally requires an adjustment of network 52, 54. Elements 60, 52, and 54 should be interactively designed in order to preserve the correct response at both the fundamental frequency and third-harmonic frequency.

In a second preferred embodiment, the compensating element 60 is absorbed into other networks, resulting in a more compact circuit. The resulting circuit, shown in FIG. 5, achieves the benefits of properly terminating the third harmonic without sacrificing physical space to include the additional element 60. By simultaneous optimization of elements 42, 44, 48, 50, 52, and 54, the correct fundamental and second-harmonic responses may be achieved while minimizing the imaginary part of total third-harmonic admittance. This realizes the conditions for high-efficiency operation of amplifier-transistor 40, but without using a separate third-harmonic tuning element 60. It should be noted that the schematic of FIG. 5 looks the same as a prior art circuit without a harmonic termination, except that some element values are adjusted (e.g. inductor 48 and capacitor 50 could be adjusted) with some change in bandwidth, to remain resonant at the second harmonic frequency. The space savings possible with this technique is especially pertinent to GaAs because of its cost, and important in integrated circuits generally because of die size limitations.

Figure 5:
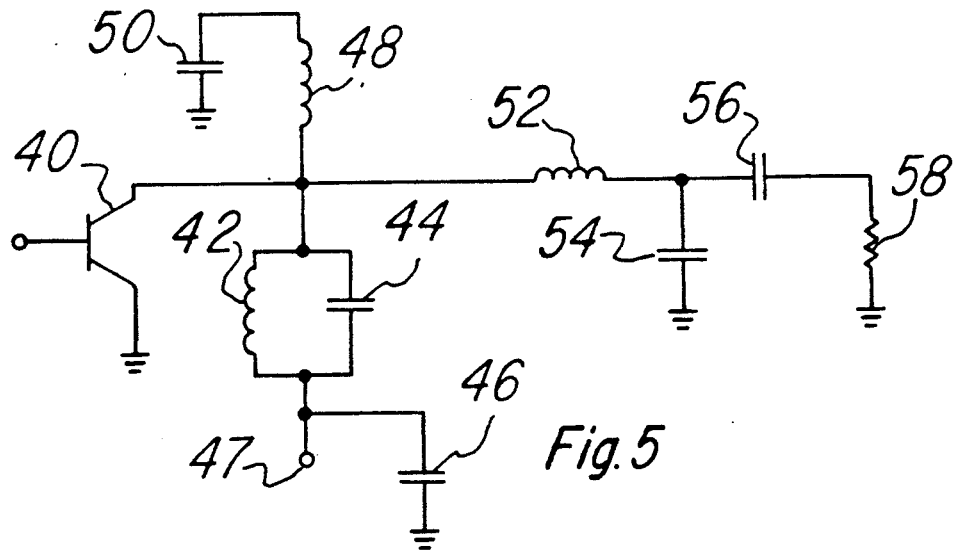
FIG. 5 is a schematic diagram of a second preferred embodiment amplifier circuit where the third-harmonic termination is provided by adjusting values of pre-existing parallel susceptances.

A result of the implementation of FIG. 5 is that additional constraints are placed on one or more elements. This limits the degrees of freedom for the overall circuit. For example, if element 60 were desired to be a capacitor, it could be "absorbed" by making capacitor 44 larger. This would force inductor 42 to become smaller in order to maintain parallel resonance at the fundamental frequency, which would alter the bandwidth of the resonance. At least one additional iteration can be done to arrive at a preferable combination of bandwidths.

A few preferred embodiments have been described in detail hereinabove. It is to be understood that the scope of the invention also comprehends embodiments different from those described, yet within the scope of the claims. For example, the invention can be used as effectively in an amplifier that incorporates a Field Effect Transistor, rather that the bipolar transistor described in the aforementioned embodiments.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for terminating a third harmonic frequency of a transistor amplifier comprising:
   determining the magnitude of the susceptance at said third harmonic frequency of initial circuitry attached to an output of a transistor, wherein said initial circuitry has no third harmonic termination;
   determining whether the susceptance of said circuitry attached to the output of said transistor is capacitive or inductive at said third harmonic frequency; and
   adding compensating parallel susceptance to the output of said transistor that is substantially equal in magnitude to the susceptance of said initial circuitry attached to the output of said transistor, but capacitive if said susceptance of said circuitry presented to the output of said transistor is inductive, or inductive if said susceptance presented to the output of said transistor is capacitive, whereby the imaginary part of the susceptance of the total circuitry attached to the output of said transistor is made small at said third harmonic frequency.

2. The method of claim 1 further comprising the step of forming said initial circuitry to include a fundamental-frequency matching circuit and a bias circuit.

3. The method of claim 2 wherein said step of adding compensating parallel susceptance to said output of said transistor comprises adding a shunt capacitance to said output of said transistor.

4. The method of claim 2 further comprising the step of forming said bias circuit to include a parallel-resonant network comprising an inductive element and a capacitive element, said resonant network being resonant at a fundamental frequency of said transistor-amplifier.

5. The method of claim 4 further comprising the step of adding the value of said compensating susceptance to said inductive element or said capacitive element of said bias circuit, and further wherein the inductance or capacitance of an element to which the compensating element is not added is adjusted so that said parallel resonant network is resonant at said fundamental frequency after said compensating susceptance is added to said inductive element or said capacitive element of said bias circuit.

6. The method of claim 2 further comprising the step of connecting a network for terminating a second harmonic frequency to said output of said transistor, said network comprising an inductive element in series with a capacitive element.

7. The method of claim 6 further comprising the step of adding the value of said compensating susceptance to said inductive element or said capacitive element of said network for terminating said second harmonic frequency, and further wherein the inductance or capacitance of an element to which the compensating element is not added is adjusted so that said network for terminating said second harmonic frequency is resonant at said second harmonic frequency.

8. The method of claim 1 further comprising the step of forming said transistor, wherein said transistor comprises a heterojunction.

9. A circuit for terminating a third harmonic frequency of a transistor amplifier comprising:
   a matching circuit connected to an output of said transistor, said matching circuit having a first susceptance at said third harmonic frequency;
   a bias circuit connected to said output of said transistor, said bias circuit having a second susceptance at said third harmonic frequency; and
   a parallel compensating susceptance connected to an output of said transistor that is substantially equal in magnitude to the sum of said first susceptance and said second susceptance, but capacitive if said sum is inductive, or inductive if said sum is capacitive, whereby the imaginary part of the susceptance of the total circuitry attached to the output of said transistor is made small at said third harmonic frequency.

10. The circuit of claim 9 wherein said compensating susceptance is capacitive.

11. The circuit of claim 9 wherein said matching circuit comprises a series inductance and a shunt capacitance.

12. The circuit of claim 9 wherein said bias circuit comprises a parallel resonant network comprising an inductive element and a capacitive element, said resonant network being resonant at a fundamental frequency of said transistor.

13. The circuit of claim 9 further comprising a network for terminating a second harmonic frequency of said transistor amplifier.

14. The circuit of claim 9 wherein said transistor is a heterojunction bipolar transistor.

15. A circuit for terminating a third harmonic frequency of a transistor comprising:
   a matching circuit connected to an output of said transistor, said matching circuit having a first susceptance at said third harmonic frequency;
   a bias circuit connected to said output of said transistor, said bias circuit having a second susceptance at said third harmonic frequency, wherein the sum of said first susceptance and said second susceptance is small at said third harmonic frequency.

16. The circuit of claim 15 wherein said matching circuit comprises a series inductance and a shunt capacitance.

17. The circuit of claim 15 wherein said bias circuit comprises a parallel resonant network comprising an inductive element and a capacitive element, said resonant network being resonant at a fundamental frequency of said transistor.

18. The circuit of claim 15 wherein said transistor is a heterojunction bipolar transistor.

19. A circuit for terminating a third harmonic frequency of a transistor comprising:
- a matching circuit connected to an output of said transistor, said matching circuit having a first susceptance at said third harmonic frequency;
- a bias circuit connected to said output of said transistor, said bias circuit having a second susceptance at said third harmonic frequency; and
- a network for terminating a second harmonic frequency of said transistor amplifier, said network having a third susceptance, and further wherein the sum of said first susceptance, said second susceptance, and said third susceptance is small at said third harmonic frequency.

20. The circuit of claim 19 wherein said matching circuit comprises a series inductance and a shunt capacitance.

21. The circuit of claim 19 wherein said bias circuit comprises a parallel resonant network comprising an inductive element and a capacitive element, said resonant network being resonant at a fundamental frequency of said transistor.

22. The circuit of claim 19 wherein said transistor is a heterojunction bipolar transistor.

* * * * *